(12) United States Patent
Furuuchi

(10) Patent No.: US 10,092,883 B2
(45) Date of Patent: Oct. 9, 2018

(54) WATERPROOF VENTILATION STRUCTURE AND WATERPROOF VENTILATION MEMBER

(71) Applicant: NITTO DENKO CORPORATION, Ibaraki-shi, Osaka (JP)

(72) Inventor: Kouji Furuuchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 26 days.

(21) Appl. No.: 15/022,423

(22) PCT Filed: Oct. 10, 2014

(86) PCT No.: PCT/JP2014/005190
§ 371 (c)(1),
(2) Date: Mar. 16, 2016

(87) PCT Pub. No.: WO2015/064028
PCT Pub. Date: Jul. 5, 2015

(65) Prior Publication Data
US 2016/0228826 A1   Aug. 11, 2016

(30) Foreign Application Priority Data

Oct. 30, 2013   (JP) .................................. 2013-225346

(51) Int. Cl.
*B32B 1/06* (2006.01)
*B32B 7/12* (2006.01)
(Continued)

(52) U.S. Cl.
CPC ........... *B01D 71/32* (2013.01); *B01D 53/268* (2013.01); *H04M 1/18* (2013.01); *H04R 1/023* (2013.01);
(Continued)

(58) Field of Classification Search
CPC ...... B32B 1/06; B32B 7/12; B32B 3/00; B32B 1/02; B32B 38/10; B01D 46/00; B01D 53/04; B01D 53/22
(Continued)

(56) References Cited

U.S. PATENT DOCUMENTS 5,417,743 A * 5/1995 Dauber ................ B01D 46/10
360/99.15
5,891,223 A * 4/1999 Shaw ..................... B01D 46/10
55/385.4
(Continued)

FOREIGN PATENT DOCUMENTS

CN   102985153 A   3/2013
JP   9-046403   2/1997
(Continued)

OTHER PUBLICATIONS

Office Action issued for European Patent Application No. 14858454.3, dated Mar. 8, 2018, 5 pages.

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

Provided is a waterproof ventilation structure including: a housing (20) including an inner space (22) and an opening portion (21); a waterproof gas-permeable membrane (11) placed to cover the opening portion (21); an electroacoustic transducing part (40) placed in the inner space (22); a first double-faced adhesive tape (31) directly joining an inner surface of the housing (20) and an edge portion of one surface of the waterproof gas-permeable membrane (11) together; and a second double-faced adhesive tape (32) directly joining an edge portion of the other surface of the waterproof gas-permeable membrane (11) and the part (40) together. The waterproof gas-permeable membrane (11) has (Continued)

a water entry pressure of 50 kPa or more, and the first double-faced adhesive tape (31) includes a base including a foam material. The total thickness of the waterproof gas-permeable membrane (11) and the first and second double-faced adhesive tapes (31) and (32), as measured in an uncompressed state, is preferably larger than a distance L between the inner surface of the housing (20) and the part (40) so that the foam material placed in the waterproof ventilation structure is compressed in a thickness direction.

8 Claims, 2 Drawing Sheets

(51) Int. Cl.
    *B32B 3/00*       (2006.01)
    *B32B 1/02*       (2006.01)
    *B32B 38/10*      (2006.01)
    *B01D 46/00*      (2006.01)
    *B01D 53/04*      (2006.01)
    *B01D 53/22*      (2006.01)
    *B01D 71/32*      (2006.01)
    *B01D 53/26*      (2006.01)
    *H04M 1/18*      (2006.01)
    *H04R 1/08*      (2006.01)
    *H05K 5/02*      (2006.01)
    *H05K 5/06*      (2006.01)
    *H04R 1/02*      (2006.01)

(52) U.S. Cl.
    CPC ........... *H04R 1/086* (2013.01); *H05K 5/0213* (2013.01); *H05K 5/06* (2013.01); *H04R 2499/11* (2013.01)

(58) Field of Classification Search
    USPC ........... 55/385.4, 385.6, 482, 504, 505, 524; 96/134, 4; 360/97.02; 428/36.5, 34.1, 428/35.7; 156/247
See application file for complete search history.

(56) References Cited

U.S. PATENT DOCUMENTS

| | | | | |
|---|---|---|---|---|
| 5,997,614 | A | * | 12/1999 | Tuma .................... B01D 46/10 360/99.19 |
| 6,512,834 | B1 | * | 1/2003 | Banter .................. H04R 1/086 381/189 |
| 7,611,557 | B2 | * | 11/2009 | Hoffman .............. G11B 33/146 219/735 |
| 8,431,204 | B2 | | 4/2013 | Ueki et al. |
| 2005/0077102 | A1 | | 4/2005 | Banter et al. |
| 2011/0069855 | A1 | | 3/2011 | Tokuda et al. |
| 2011/0117304 | A1 | * | 5/2011 | Ueki .................... H04R 1/023 428/36.5 |
| 2013/0074691 | A1 | | 3/2013 | Furuyama et al. |

FOREIGN PATENT DOCUMENTS

| | | | |
|---|---|---|---|
| JP | 2003-503991 | | 1/2003 |
| JP | 2010-004397 | | 1/2010 |
| JP | 2010-110001 | | 5/2010 |
| JP | 2010-241047 | | 10/2010 |
| JP | 2010-260880 | A2 † | 11/2010 |
| KR | 2012-0101088 | A † | 9/2012 |
| WO | 01/03468 | | 1/2001 |
| WO | 01/03468 | | 1/2011 |

\* cited by examiner
† cited by third party

WATERPROOF VENTILATION STRUCTURE AND WATERPROOF VENTILATION MEMBER

TECHNICAL FIELD

The present invention relates to a waterproof ventilation structure and a waterproof ventilation member suitable for constructing this waterproof ventilation structure.

BACKGROUND ART

A housing of a portable electronic device, such as a mobile phone, a smartphone, or a laptop computer, is provided with an opening portion for maintaining ventilation between the inside and outside of the housing. The opening portion allows elimination of pressure difference caused by temperature difference between the inside and outside of the housing and also ensures sound transmission between the inside and outside of the housing in which an electroacoustic transducing part such as a microphone or a speaker is placed. It is becoming increasingly common to place a waterproof gas-permeable membrane over the opening portion to prevent entry of water into the housing. The waterproof gas-permeable membrane is typically a PTFE membrane made porous by stretching (stretched porous PTFE membrane).

A waterproof ventilation member is also known which includes a waterproof gas-permeable membrane and a fixing member which are preliminarily integrated together to increase the ease of attachment of the waterproof ventilation member to the opening portion. As the fixing member there is used, for example, a double-faced adhesive tape attached to an edge portion of a waterproof gas-permeable membrane (see, for example, Patent Literature 1, in which the tape is referred to as "double-faced bonding tape"). Patent Literature 1 discloses an assembly including: a pair of double-faced adhesive tapes so joined to a stretched porous PTFE membrane that the stretched porous PTFE membrane lies between the double-faced adhesive tapes; and an acoustic gasket joined to one of the double-faced adhesive tapes. A foam material such as a silicone foam is used as the material of the acoustic gasket.

CITATION LIST

Patent Literature

Patent Literature 1: JP 2003-503991 A

SUMMARY OF INVENTION

Technical Problem

Double-faced adhesive tapes are thin, relatively inexpensive fixing members. However, a waterproof ventilation structure constructed by attaching to a housing a waterproof ventilation member having a double-faced adhesive tape as a fixing member has a problem in that the water resistance of the structure is considerably lower than expected from the water resistance of the waterproof gas-permeable membrane per se. In particular, the use of a waterproof gas-permeable membrane having excellent water resistance leads to an increased disparity between the water resistance of the waterproof gas-permeable membrane per se and the water resistance of the waterproof ventilation structure. Besides, it is desirable to exclude the acoustic gasket in terms of production cost, although the acoustic gasket is useful for removing a drawback such as structural vibration and converging the acoustic energy to the opening portion.

It is therefore an object of the present invention to provide a waterproof ventilation structure that makes a waterproof gas-permeable membrane more likely to exhibit its intrinsic high water resistance despite the use of a double-faced adhesive tape and that requires no acoustic gasket. Another object of the present invention is to provide a waterproof ventilation member suitable for constructing this waterproof ventilation structure.

Solution to Problem

The present invention provides a waterproof ventilation structure including: a housing including an inner space and an opening portion allowing the inner space to communicate with an outer space; a waterproof gas-permeable membrane placed to cover the opening portion; and an electroacoustic transducing part placed in the inner space. The waterproof ventilation structure further includes: a first double-faced adhesive tape directly joining an inner surface of the housing and an edge portion of one surface of the waterproof gas-permeable membrane together; and a second double-faced adhesive tape directly joining an edge portion of the other surface of the waterproof gas-permeable membrane and the electroacoustic transducing part together. The waterproof gas-permeable membrane has a water entry pressure of 50 kPa or more as measured by high hydraulic pressure method specified in Japanese Industrial Standards (JIS) L 1092. The first double-faced adhesive tape includes a base including a foam material.

The present invention also provides a waterproof ventilation member including: a waterproof gas-permeable membrane; a first double-faced adhesive tape joined to an edge portion of one surface of the waterproof gas-permeable membrane; and a second double-faced adhesive tape joined to an edge portion of the other surface of the waterproof gas-permeable membrane. The first double-faced adhesive tape includes a base including a foam material.

Advantageous Effects of Invention

A conventional waterproof ventilation structure including a waterproof gas-permeable membrane with excellent water resistance and a double-faced adhesive tape as a fixing member, upon application of a water pressure to the waterproof gas-permeable membrane, generally suffers water entry occurring between the double-faced adhesive tape and the housing before the occurrence of water leakage from the waterproof gas-permeable membrane. By contrast, the waterproof ventilation structure of the present invention can prevent water entry from occurring between the double-faced adhesive tape and the housing and make the waterproof gas-permeable membrane more likely to exhibit its high water resistance. Furthermore, the waterproof ventilation structure of the present invention employs a foam material as a base of the double-faced adhesive tape, which can reduce the loss of acoustic energy due to, for example, structural vibration even without the use of any acoustic gasket.

DESCRIPTION OF EMBODIMENTS

Hereinafter, embodiments of the present invention will be described with reference to the drawings.

Figure 1:
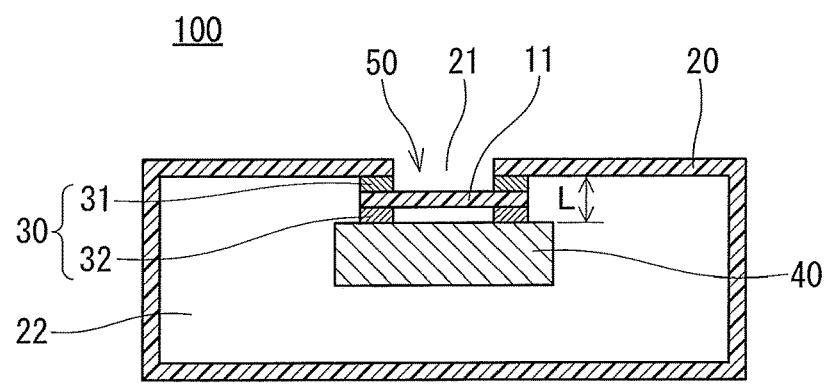
FIG. 1 is a cross-sectional view showing an example of the waterproof ventilation structure of the present invention.

A waterproof ventilation structure 100 shown in FIG. 1 includes: a housing 20 having an opening portion 21; and a waterproof gas-permeable membrane 11 placed to cover the opening portion 21. An inner space 22 of the housing 20 communicates with an outer space via the opening portion 21 covered by the waterproof gas-permeable membrane 11. A gas passing through the opening portion 21 traverses the waterproof gas-permeable membrane 11 to enter the inner space 22 of the housing 20 or exit to the outer space.

The waterproof gas-permeable membrane 11 includes a stretched porous polytetrafluoroethylene (PTFE) membrane. The waterproof gas-permeable membrane 11 of the present embodiment is a single-layer membrane consisting of a stretched porous PTFE membrane. The waterproof gas-permeable membrane 11 may be composed of two or more layers including a stretched porous PTFE membrane. More specifically, the waterproof gas-permeable membrane 11 may include two or more stretched porous PTFE membranes when, for example, the membrane 11 is required to have an increased water resistance. Examples of other types of membranes that may be added to the waterproof gas-permeable membrane 11 include gas-permeable supporting materials such as a non-woven fabric, a woven fabric, and a mesh. Such a gas-permeable supporting material can reinforce the waterproof gas-permeable membrane 11 to enhance the mechanical strength and handleability of the waterproof gas-permeable membrane.

The water resistance of the waterproof gas-permeable membrane 11, as expressed by a value measured by high hydraulic pressure method specified in JIS L 1092, is 50 kPa or more, preferably 70 kPa or more, and more preferably 100 kPa or more. The waterproof ventilation structure 100 is particularly suitable as a waterproof structure when the waterproof gas-permeable membrane 11 used has a high water resistance as specified above.

Double-faced adhesive tapes (which will hereinafter be referred to as "double-faced tape(s)") 31 and 32 are respectively joined to edge portions of both surfaces of the waterproof gas-permeable membrane 11. The double-faced tapes 31 and 32 function as fixing members 30 of the waterproof gas-permeable membrane. The first double-faced tape 31 lies between the inner surface of the housing 20 and one surface of the waterproof gas-permeable membrane 11 close to the opening portion and directly joins the waterproof gas-permeable membrane 11 and the housing 20 together. The second double-faced tape 32 lies between the other surface of the waterproof gas-permeable membrane 11 remote from the opening portion and an electroacoustic transducing part (which will hereinafter be referred to as "acoustic part") 40 and directly joins the waterproof gas-permeable membrane 11 and the acoustic part 40 together. Thus, the waterproof gas-permeable membrane 11 is held and fixed between the inner surface of the housing 20 and the acoustic part 40 by the double-faced tapes 31 and 32.

The acoustic part 40 is an electronic part typified by a speaker, a microphone, or a buzzer, and coverts an electrical energy to an acoustic energy or vice versa. It is preferable that the acoustic part 40 be fixed inside the housing 20 and support the waterproof gas-permeable membrane 11 at a predetermined distance L from the inner surface of the housing 20. The fixing of the acoustic part 40 is preferably accomplished with a supporting member other than the fixing members 30 (31 and 32), such as a resin-made part directly integrated with the housing, although the supporting member is not shown in the drawings. The acoustic part 40, however, may be positioned by fixing it directly onto the inner surface of one wall of the housing 20 in which the opening portion 21 is formed (the upper wall in FIG. 1) and the inner surface of the opposite wall of the housing 20 (the lower wall in FIG. 1).

Figure 2:
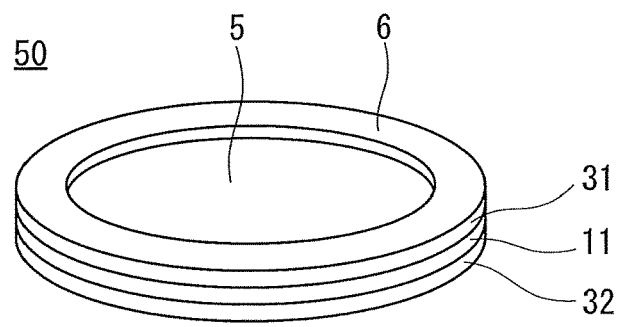
FIG. 2 is a perspective view of a waterproof ventilation member used in the waterproof ventilation structure shown in FIG. 1.
Figure 3:
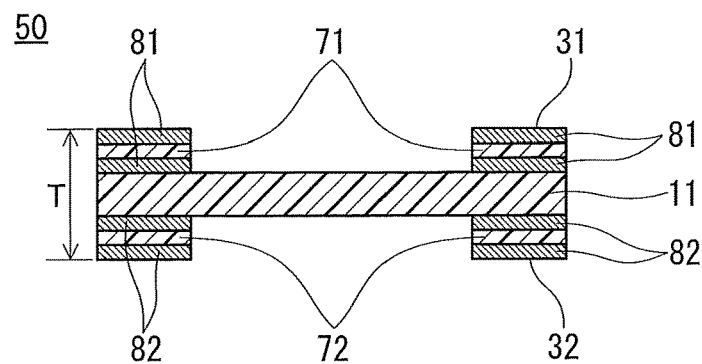
FIG. 3 is a cross-sectional view of the waterproof ventilation member used in the waterproof ventilation structure shown in FIG. 1.

FIG. 2 and FIG. 3 show an example of a waterproof ventilation member 50 suitable for constructing the waterproof ventilation structure 100. The waterproof ventilation member 50 includes the waterproof gas-permeable membrane 11, the first double-faced tape 31 joined to an edge portion of one surface of the waterproof gas-permeable membrane 11, and the second double-faced tape 32 joined to an edge portion of the other surface of the waterproof gas-permeable membrane 11. The double-faced tapes 31 and 32 are placed to cover the entireties of edge regions 6 of the waterproof gas-permeable membrane 11. In other words, the double-faced tapes 31 and 32 form closed frames on the waterproof gas-permeable membrane 11, and the closed frames define a gas-permeation region 5 of the waterproof gas-permeable membrane 11. The double-faced tapes 31 and 32 respectively include bases 71 and 72 and adhesives (adhesive layers) 81 and 82 applied to both surfaces of the bases. The embodiment shown employs double-faced tapes 31 and 32 of ring shape. The shape of the double-faced tapes is not limited to the ring shape, and may be, for example, a rectangular frame shape.

The base 71 of the first double-faced tape 31 is a foam material. Various foamed resins can be used as the foam material as appropriate. Examples of the foamed resins include: polyolefin foams such as a polyethylene foam and a polypropylene foam; a polystyrene foam; a polyurethane foam; a polyimide foam; an EPDM foam; an acrylic foam; and a silicone foam.

In the embodiment shown, it is only the waterproof ventilation member 50 that lies between the inner surface of the housing 20 and the acoustic part 40. That is, no other members than the member 50, such as an acoustic gasket and a spacer, are placed, which fact provides a reduction in the total number of parts. The waterproof ventilation structure 100 includes the base 71 of foam material serving the function of an acoustic gasket and thus has no need to be provided with a dedicated member functioning as an acoustic gasket.

Upon water pressure being applied to the waterproof gas-permeable membrane 11 from the outside of the housing 20, the first double-faced tape 31 is strained in its thickness direction. Under this situation, the base 71 of foam material increases its own thickness and absorbs the tensile stress to some extent, thus reducing the force acting to separate the adhesive 81 from the housing 20. This buffering action can more effectively operate when the base 71 has been preliminarily compressed in its thickness direction.

The inner surface of the housing 20 may have minute irregularities which are inevitably formed during production of the housing 20. If such minute irregularities weaken the adhesive strength between the housing 20 and the first double-faced tape 31 locally, water would enter through the portion with weakened adhesive strength and promote the detachment of the first double-faced tape 31 from the housing 20. However, the base 71 of foam material is well compatible with irregular surfaces and thus reduces the local formation of a portion with weakened adhesive strength. This adhesive strength uniforming action can more effectively operate when the first double-faced tape 31 is so attached that the base 71 becomes compressed in its thickness direction.

To achieve a sufficient level of the above effect, the base 71 of foam material preferably has a thickness of 50 μm or more, particularly 100 μm or more. For example, a thickness of 100 to 2000 μm is suitable. The preferred thickness of the first double-faced tape 31 inclusive of the adhesive 81 is 100 μm or more, particularly 150 μm or more and is, for example, 150 to 2050 μm. It should be noted that the above values of the thicknesses of the base 71 and the double-faced tape 31 are those specified for an uncompressed state (the state of the base and tape prior to their placement inside the housing 20 or incorporation into the waterproof ventilation structure 100).

The type of the adhesive 81 of the first double-faced tape 31 is not particularly limited. Suitable as the adhesive 81 is a composition containing a polymer resulting from polymerization of a combination of monomers including butyl acrylate (BA), vinyl acetate (VA), and acrylic acid (AA). Particularly suitable is a composition containing this polymer and a tackifier, especially a rosin ester resin. The polymer is preferably one that results from polymerization of the combination of monomers in which the weight ratio BA:VA is 92 to 99.5:8 to 0.05, particularly 98 to 99.5:2 to 0.05 with respect to the total weight of BA and VA defined as 100 and in which the content of AA is 1 to 5 weight % with respect to the total weight of BA and VA. The total weight of BA, VA, and AA is preferably 90 weight % or more and particularly preferably 95 weight % or more with respect to the total weight of all monomers.

The second double-faced tape 32 may have a foam material as the base 72, similarly to the first double-faced tape 31. However, it suffices for the second double-faced tape 32 to be a commonly-used double-faced tape. The base 72 of a commonly-used double-faced tape is typically a non-foam material made of a resin such as PET. The use of a commonly-known double-faced tape can prevent an extra increase in production cost.

The total thickness T (shown in FIG. 3) of the waterproof ventilation member 50 is preferably set larger than the distance L (shown in FIG. 1) between the inner surface of the housing 20 and the acoustic part 40 fixed in the inner space 22 of the housing 20. The thickness T is also determined for the member 50 that is not compressed in its thickness direction. That is, in this preferred embodiment, the total thickness T of the waterproof gas-permeable membrane 11, the first double-faced adhesive tape 31, and the second double-faced adhesive tape 32, as measured in the uncompressed state prior to placement in the waterproof ventilation structure 100, is larger than the distance L between the inner surface of the housing 20 and the acoustic part 40. The structure consequently has the foam material 71 compressed in its thickness direction within the housing 20, which promotes, for example, the buffering action of the base 71 of foam material. The difference (T–L) may be adjusted as appropriate. The difference (T–L) is typically about 5 to 50%, and preferably 10 to 40%, of the thickness of the base 71 of the first double-faced tape 31.

Hereinafter, the present invention will be described in more detail by way of Examples. It should be noted that the present invention is not limited by Examples given below.

Example 1

To 100 parts by weight of a PTFE fine powder (F104, manufactured by DAIKIN INDUSTRIES, LTD.) was added 20 parts by weight of a liquid lubricant (normal decane) to prepare a pasty mixture. The mixture was paste-extruded into the form of a cylindrical rod, which was then flattened by pressure to a thickness of 0.2 mm to obtain a PTFE sheet. Next, the PTFE sheet is placed in a drying oven at 150° C. to remove the liquid lubricant from the sheet. Furthermore, the PTFE sheet was stretched lengthwise by a factor of 5 at 280° C. and stretched widthwise by a factor of 20 at 130° C. This was followed by sintering in an oven at 360° C. The stretched porous PTFE membrane prepared had a thickness of 20 μm and had a water entry pressure of 200 kPa as measured by the high hydraulic pressure method specified in JIS L 1092.

An amount of 2.9 parts by weight of acrylic acid (AA), 5 parts by weight of vinyl acetate (VA), 92 parts by weight of butyl acrylate (BA), 0.1 parts by weight of hydroxyethyl acrylate (HEA), and 30 parts by weight of ethyl acetate and 120 parts by weight of toluene as polymerization solvents, were put into a reaction container equipped with a stirrer, a reflux condenser, a thermometer, a dropping device, and a nitrogen introduction tube, and were stirred for 2 hours with nitrogen gas being introduced. After oxygen was thus removed from the polymerization system, 0.2 parts by weight of 2,2'-azobisisobutyronitrile (AIBN) was added to the system, which was allowed to rise in temperature to 60° C. and undergo 6-hour polymerization. Thus, a polymer solution (preparative adhesive solution) was obtained. The concentration of the polymer solid content in the polymer solution was 40.0 weight %, and the weight-average molecular weight of the polymer was 500,000.

To the polymer solution were added 10 parts by weight of a rosin ester resin (manufactured by ARAKAWA CHEMICAL INDUSTRIES, LTD. under the trade name "PENSEL D-125" and having a solid content of 100%), 10 parts by weight of a rosin ester resin (manufactured by ARAKAWA CHEMICAL INDUSTRIES, LTD. under the trade name "SUPER ESTER A-100" and having a solid content of 100%), 5 parts by weight of a rosin ester resin (manufactured by Eastman Chemical Company under the trade name "Foralyn 8020F" and having a solid content of 100%) and 15 parts by weight of a terpene phenolic resin (manufactured by ARAKAWA CHEMICAL INDUSTRIES, LTD. under the trade name "TAMANOL 803L" and having a solid content of 100%) with respect to 100 parts by weight of the polymer. The solution was stirred thoroughly to dissolve the added resins. To the solution was then added 2.0 parts by weight of aromatic polyisocyanate as a crosslinking agent (manufactured by Nippon Polyurethane Industry Co., Ltd. under the trade name "Coronate L" and having a solid content of 75%) with respect to 100 parts by weight of the polymer. The solution was stirred thoroughly to yield an adhesive.

This adhesive was applied to both surfaces of a 100-μm-thick polyethylene foam (manufactured by Sekisui Chemical Co., Ltd. under the trade name "Volara XL-H #03001") to give a double-faced tape (first double-faced tape) having a total thickness of 0.2 mm. A circular through hole with a diameter of 10 mm was formed in the first double-faced tape, and then the adhesive on one surface of the first double-faced tape was joined to the stretched porous PTFE membrane.

Besides, a double-faced tape (manufactured by NITTO DENKO CORPORATION, No. 532) was prepared as a second double-faced tape. This double-faced tape has a thickness of 0.06 mm and its base is a polyester film (non-foam material). A circular through hole with a diameter of 10 mm was formed in the second double-faced tape, and then the adhesive on one surface of the second double-faced tape was joined to the stretched porous PTFE membrane in such a manner that the through hole of the second double-faced tape on one surface of the stretched porous PTFE membrane was positioned in register with the through hole of the first double-faced tape on the other surface of the stretched porous PTFE membrane. Subsequently, the stretched porous PTFE membrane to which were attached the first and second double-faced tapes was punched to give a 12-mm-diameter circular piece concentric with the through holes, thus obtaining a waterproof ventilation member including a circular stretched porous PTFE membrane and ring-shaped double-faced tapes respectively joined to both surfaces of the membrane along the circumferences of the surfaces.

Figure 4:
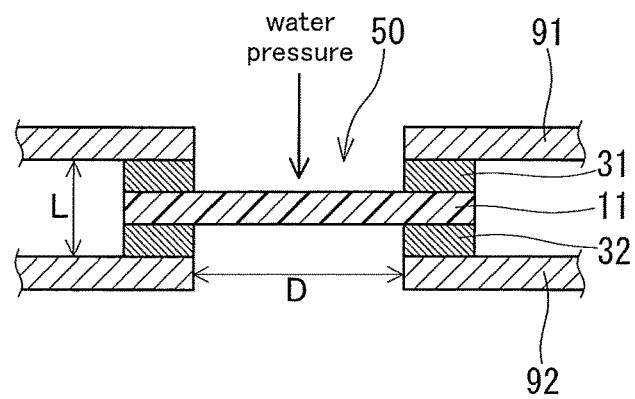
FIG. 4 is a cross-sectional view showing the configuration of a device used in a water resistance test conducted for Examples.

A water resistance test using jigs shown in FIG. 4 was conducted on the waterproof ventilation member 50. For this measurement, the first double-faced tape 31 and the second double-faced tape 32 respectively placed on both surfaces of the waterproof gas-permeable membrane (stretched porous PTFE membrane) 11 were respectively joined to the inner surfaces of the jigs 91 and 92 to hold the waterproof ventilation member 50. The distance L between the jigs 91 and 92 was fixed at 0.25 mm. The distance L was 0.03 mm smaller than a total thickness T of 0.28 mm of the base 11 and the double-faced tapes 31 and 32 in the waterproof ventilation member 50. The difference (T−L) corresponded to 30% of a thickness of 100 µm of the base of the first double-faced tape 31. The diameter D of the opening portion provided in each of the measurement jigs 91 and 92 was 10 mm. In the water resistance test, a water pressure was applied to the surface of the waterproof gas-permeable membrane 11 to which the first double-faced tape 31 was joined. In the test, application of a water pressure of 70 kPa caused no observable water leakage. More specifically, in this test, water permeated the waterproof gas-permeable membrane 11 (water leakage from the waterproof gas-permeable membrane 11 occurred) when the applied water pressure was 200 kPa.

Example 2

A water resistance test was conducted in the same manner as in Example 1, except for changing the distance L to 0.28 mm so that the distance L and the total thickness T were equal. In this test, application of a water pressure of 70 kPa caused water leakage between the jig 91 and the double-faced tape 31.

Comparative Example 1

Figure 5:
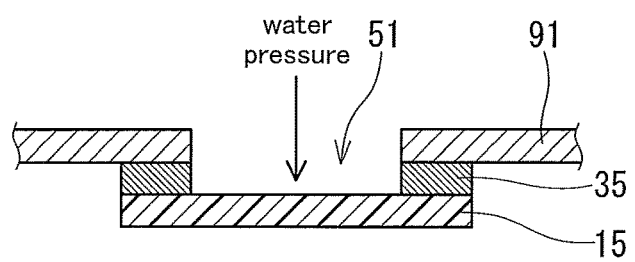
FIG. 5 is a cross-sectional view showing the configuration of a device used in a water resistance test conducted for Comparative Examples.

To one surface of a stretched porous PTFE membrane prepared in the same manner as in Example 1 was joined a double-faced tape (manufactured by NITTO DENKO COR-PORATION, No. 532) provided with a 10-mm-diameter circular through hole. The stretched porous PTFE membrane was then punched to give a 12-mm-diameter circular piece concentric with the through hole, thus obtaining a waterproof ventilation member including a circular stretched porous PTFE membrane and a ring-shaped double-faced tape joined to one surface of the membrane along the circumference of the surface. A water resistance test was conducted in which, as shown in FIG. 5, the surface of the double-faced tape 35 opposite to the surface joined to the stretched porous PTFE membrane was joined to the inner surface of the measurement jig 91 to hold the waterproof ventilation member 51. Application of a water pressure of 45 kPa caused water leakage between the jig 91 and the double-faced tape 35.

Comparative Example 2

A stretched porous PTFE membrane was prepared in the same manner as in Example 1, except for changing the temperature for the lengthwise stretching of the PTFE sheet to 330° C. and changing the stretching factor for the widthwise stretching to 10. The stretched porous PTFE membrane obtained had a thickness of 30 µm and had a water entry pressure of 40 kPa as measured by the high hydraulic pressure method specified in JIS L 1092.

A waterproof ventilation member was prepared in the same manner as in Example 1, except for using the stretched porous PTFE membrane of Comparative Example 2.

A water resistance test was conducted in the same manner as in Example 1 (see FIG. 4), except for using the waterproof ventilation member of Comparative Example 2. In this test, application of a water pressure of 40 kPa caused water leakage from the waterproof gas-permeable membrane.

Reference Example 1

Figure 6:
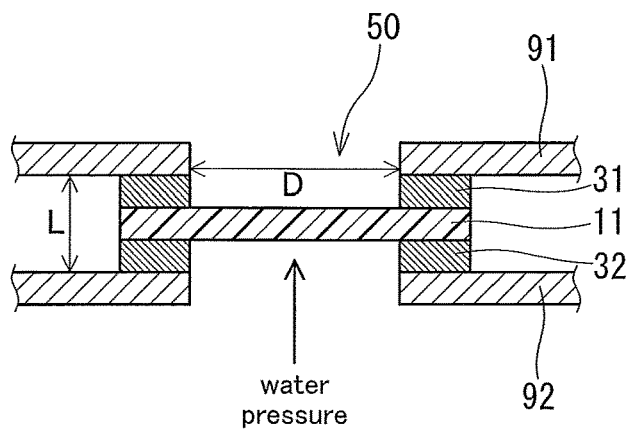
FIG. 6 is a cross-sectional view showing the configuration of a device used in a water resistance test conducted for Reference Examples.

A waterproof ventilation member 50 was prepared in the same manner as in Example 1. In the water resistance test of Reference Example 1, a water pressure was applied, as shown in FIG. 6, to the surface of the waterproof gas-permeable membrane 11 to which the second double-faced tape 32 was joined (the surface opposite to that subjected to water pressure in Example 1). This test employed the same conditions as used in the test of Example 1, except for the direction of the applied water pressure. In this test, application of a water pressure of 45 kPa caused water leakage between the jig 92 and the double-faced tape 32.

Reference Example 2

A waterproof ventilation member was prepared in the same manner as in Comparative Example 2. In the water resistance test of Reference Example 2, a water pressure was applied, as shown in FIG. 6, to the surface of the waterproof gas-permeable membrane 11 to which the second double-faced tape 32 was joined (the surface opposite to that subjected to water pressure in Comparative Example 2). This test employed the same conditions as used in the test of Comparative Example 2, except for the direction of the applied water pressure. In this test, application of a water pressure of 40 kPa caused water leakage from the waterproof gas-permeable membrane.

Comparison Between Example 1 and Example 2

In the water resistance test of Example 2, water leakage occurred between the jig 91 and the double-faced tape 31 when the applied water pressure was increased up to 70 kPa. By contrast, in Example 1, even the application of a water pressure of 70 kPa caused no water leakage between the jig 91 and the double-faced tape 31. This obtained result shows that water leakage between the jig 91 and the double-faced tape 31 is less likely to occur in Example 1 than in Example 2. This can be attributed to the fact that the foam material included in the first double-faced tape was compressed in its thickness direction in Example 1.

Comparison Between Example 1 and Reference Example 1 and Comparison Between Comparative Example 2 and Reference Example 2

In Example 1 and Reference Example 1, the water resistance tests were conducted using the same waterproof ventilation structure including a waterproof gas-permeable membrane with excellent water resistance and using the same conditions except for the direction of the applied water pressure. In Comparative Example 2 and Reference Example 2, the water resistance tests were conducted using the same waterproof ventilation structure including a waterproof gas-permeable membrane with poor water resistance and using the same conditions except for the direction of the applied water pressure. Increasing the water pressure eventually caused water leakage from the waterproof gas-permeable membrane in the test of Example 1 and water leakage between the jig and the double-faced tape in the test of Reference Example 1. For Comparative Example 2 and Reference Example 2, water leakage from the waterproof gas-permeable membrane occurred in the tests of both Comparative Example 2 and Reference Example 2. The results for Example 1 and Reference Example 1 demonstrate that, when the waterproof gas-permeable membrane used has excellent water resistance, the water resistance of the waterproof ventilation structure as a whole depends on the ability to prevent water leakage between the double-faced tape and the housing. The results for Comparative Example 2 and Reference Example 2 demonstrate that, when the waterproof gas-permeable membrane used has poor water resistance, the water resistance of the waterproof ventilation structure as a whole depends on the water resistance of the waterproof gas-permeable membrane rather than on the ability to prevent water leakage between the double-faced tape and the housing. That is, these results demonstrate that the employment of a foam material as the base of the first double-faced adhesive tape beneficially provides the effect of preventing water entry from occurring between the first double-faced adhesive tape and the housing, particularly when the waterproof gas-permeable membrane used has excellent water resistance. These results also reveal that this effect is not merely theoretical but is useful in a waterproof ventilation structure employing materials which can be actually used.

The invention claimed is:

1. A waterproof ventilation structure comprising:
 a housing comprising an inner space and an opening portion allowing the inner space to communicate with an outer space;
 a waterproof gas-permeable membrane placed to cover the opening portion; and
 an electroacoustic transducing part placed in the inner space, wherein
 the waterproof ventilation structure further comprises:
 a first double-faced adhesive tape directly joining an inner surface of the housing and an edge portion of one surface of the waterproof gas-permeable membrane together; and
 a second double-faced adhesive tape directly joining an edge portion of the other surface of the waterproof gas-permeable membrane and the electroacoustic transducing part together,
 the waterproof gas-permeable membrane has a water entry pressure of 50 kPa or more as measured by high hydraulic pressure method specified in JIS L 1092, and
 the first double-faced adhesive tape comprises a base comprising a foam material.

2. The waterproof ventilation structure according to claim 1, wherein a total thickness T of the waterproof gas-permeable membrane, the first double-faced adhesive tape, and the second double-faced adhesive tape, as measured in an uncompressed state prior to placement in the waterproof ventilation structure, is larger than a distance L between the inner surface of the housing and the electroacoustic transducing part fixed in the inner space of the housing, and
 the foam material placed in the waterproof ventilation structure is compressed in a thickness direction.

3. The waterproof ventilation structure according to claim 1, wherein the second double-faced adhesive tape comprises a base comprising a non-foam material.

4. The waterproof ventilation structure according to claim 1, wherein the waterproof gas-permeable membrane comprises a stretched porous polytetrafluoroethylene membrane.

5. A waterproof ventilation member comprising:
 a waterproof gas-permeable membrane;
 a first double-faced adhesive tape joined to an edge portion of one surface of the waterproof gas-permeable membrane; and
 a second double-faced adhesive tape joined to an edge portion of the other surface of the waterproof gas-permeable membrane, wherein
 the waterproof gas-permeable membrane has a water entry pressure of 50 kPa or more as measured by high hydraulic pressure method specified in JIS L 1092, and
 the first double-faced adhesive tape comprises a base comprising a foam material.

6. The waterproof ventilation structure according to claim 2, wherein upon water pressure being applied to the waterproof gas-permeable membrane from an outside of the housing, the first double-faced tape is strained in its thickness direction, and the foam material of the first double-faced tape increases its own thickness and absorbs a tensile stress and thus reduces a force acting to separate an adhesive of the first double-faced tape from the housing.

7. The waterproof ventilation structure according to claim 2, wherein a difference between the total thickness T and the distance L is 5 to 50% of a thickness of the base of the first double-faced tape.

8. The waterproof ventilation structure according to claim 1, wherein upon water pressure being applied to the waterproof gas-permeable membrane from an outside of the housing, the water pressure causes water leakage from the waterproof gas-permeable membrane before an occurrence of water leakage between the housing and the first double-faced tape.

* * * * *